US006048654A

United States Patent [19]

Nakayama et al.

[11] Patent Number: 6,048,654

[45] Date of Patent: Apr. 11, 2000

[54] LITHOGRAPHIC PRINTING METHOD AND PRINTING PLATE PRECURSOR FOR LITHOGRAPHIC PRINTING

[75] Inventors: Takao Nakayama; Seishi Kasai, both of Shizuoka; Takashi Yamada; Koji Kamiyama, both of Kanagawa, all of Japan

[73] Assignee: Fuji Photo Film Co., Ltd., Ashigara, Japan

[21] Appl. No.: 09/153,224

[22] Filed: Sep. 14, 1998

[30] Foreign Application Priority Data

| | | | |
|---|---|---|---|
| Sep. 12, 1997 | [JP] | Japan | 9-248760 |
| Sep. 12, 1997 | [JP] | Japan | 9-248761 |
| Sep. 24, 1997 | [JP] | Japan | 9-258784 |
| Oct. 6, 1997 | [JP] | Japan | 9-272804 |
| Nov. 11, 1997 | [JP] | Japan | 9-308822 |
| Nov. 14, 1997 | [JP] | Japan | 9-313740 |

[51] Int. Cl.[7] .............................. G03C 11/00; G03F 7/12

[52] U.S. Cl. ........................ 430/19; 430/302; 101/463.1; 101/467

[58] Field of Search .................. 430/302, 19; 101/463.1, 101/467

[56] References Cited

U.S. PATENT DOCUMENTS

| | | | |
|---|---|---|---|
| 3,573,040 | 3/1971 | Back | 96/1 |
| 3,717,464 | 2/1973 | Tandy | 430/302 |
| 4,836,106 | 6/1989 | Afzali-Ardakani et al. | 101/467 |
| 5,385,092 | 1/1995 | Lewis et al. | 101/467 |

*Primary Examiner*—Janet Baxter
*Assistant Examiner*—Yvette M. Clarke
*Attorney, Agent, or Firm*—Burns, Doane, Swecker & Mathis, LLP

[57] ABSTRACT

A a lithographic printing method comprising repetition of the steps of exposing a printing plate precursor having on the surface thereof a thin layer comprising $TiO_2$, ZnO or at least one compound selected from the group consisting of $RTiO_3$ wherein R represents an alkaline earth metal atom, $AB_{2-x}C_xD_{3-x}E_xO_{10}$ wherein A represents a hydrogen atom or an alkali metal atom; B represents an alkaline earth metal atom or a lead atom; C represents a rare earth atom; D represents a metal atom of the group 5A of the Periodic Table; E represents a metal atom of the group 4A of the Periodic Table; and x represents a number of from 0 to 2, $SnO_2$, $Bi_2O_3$, and $Fe_2O_3$ to active light to make the exposed area hydrophilic, and making the hydrophilic area hydrophobic by heat treatment.

8 Claims, No Drawings

LITHOGRAPHIC PRINTING METHOD AND PRINTING PLATE PRECURSOR FOR LITHOGRAPHIC PRINTING

FIELD OF THE INVENTION

This invention relates to the field of general small printing, particularly lithographic printing. More particularly, it relates to a novel lithographic printing method including simplified platemaking and to a printing plate used therein. More specifically, it relates to a lithographic printing method capable of using a printing plate precursor repeatedly and the printing plate precursor.

BACKGROUND OF THE INVENTION

Of various printing methods, a lithographic printing method has enjoyed general use because of the ease in platemaking and has now furnished the primary printing means. The lithographic printing technique, being based on the immiscibility of oil and water, uses a printing plate selectively holding an oily material, i.e., ink, on the image area and a fountain solution on the non-image area. On contact with a printing substrate directly or indirectly via an intermediate called a blanket, the ink on the image area is transferred to the printing substrate, such as paper, to achieve printing.

The lithographic printing method primarily consists in preparation of a presensitized plate (PS plate) which comprises an aluminum plate as a support coated with a diazo photosensitive layer. In the preparation of a PS plate the surface of an aluminum plate is subjected to graining, anodizing, and other various processings to establish ink-receptivity for the image area and ink-repellency for the non-image area, to improve impression capacity and to improve precision. Therefore, lithographic printing has acquired the character of high impression capacity and of high precision as well as the ease of platemaking.

However, with the spread of printed matter, there has still been a demand in order to further ensure the ease of lithographic printing, and a number of printing methods have been proposed, seeking ease of platemaking.

Amongst the proposals typical is a printing method using a printing plate prepared by silver salt diffusion transfer as disclosed in U.S. Pat. No. 3,511,656 and JP-A-7-56351 (the term "JP-A" as used herein means an "unexamined published Japanese patent application"). Such a lithographic printing plate material includes "Copyrapid" available from Agfa-Gevaert AG. This method has been put to practical use as an easy printing method because a transfer image can be formed through one step, and the resulting transfer image, having ink-receptivity, can serve for printing as such. However easy it is, the method requires a step of diffusion transfer development with an alkali developer. Hence, an easier printing method that does not require a developing step with a developer has been anxiously awaited.

In the light of the above-mentioned situation, a simplified method of platemaking in which a developing processing with an alkali developer after imagewise exposure is omitted has been developed. In the field of this type of printing plates, which are called non-processed plates, the principal means that have been proposed to data for image formation are based on (1) imagewise exposure of a recording surface to cause thermal destruction of the irradiated area, (2) imagewise exposure of a recording surface to make the irradiated area ink-receptive through heat mode hardening, (3) imagewise exposure of a recording surface to make the irradiated area ink-receptive through light mode hardening, (4) change of surface properties through photolysis of a diazo compound, and (5) heat mode fusion heat transfer of an image area.

While the techniques listed above give manipulations for avoiding the necessity for a developer, they involve at least one of the disadvantages that (1) the difference between a lipophilic area and a hydrophilic area is insufficient and that (2) the image area is easily scratched due to insufficient mechanical strength. The disadvantage (1) causes inferior print quality and low resolution and makes it difficult to obtain a printing plate with excellent image sharpness. The disadvantage (2) necessitates formation of a protective film, which ruins the ease of platemaking, or results in insufficient durability withstanding long-term printing. In brief, mere omission of an alkali development processing from platemaking operations has failed to provide a practically useful printing method. The keen demand for a method for providing with ease a printing plate satisfying various requirements has not been fulfilled yet.

JP-A-9-169098 discloses a platemaking method taking advantage of zirconia ceramic's becoming hydrophilic on irradiation with light, which is one of non-processing platemaking techniques. However, zirconia has insufficient photosensitivity, and change from hydrophobic to hydrophilic properties by light is insufficient for creating a clear distinction between image areas and non-image areas.

In addition to a simplified platemaking method requiring no developer, a means enabling regeneration of a used printing plate for reuse would be of great advantage for reduction of cost and waste. Reuse of a printing plate relies for utility on the simpleness and ease of the operation for regeneration. To regenerate a used printing plate without a complicated operation is a technically difficult problem that has received little study. The only teaching is found in JP-A-9-169098 supra, which deals with a special material for a printing plate precursor, zirconia ceramics.

SUMMARY OF THE INVENTION

An object of the present invention is to provide a simplified lithographic printing method which requires no alkali developer in platemaking while achieving sufficient image quality for practical use, and allows the used printing plate precursor to be used repeatedly.

More specifically, the object of the present invention is to provide a lithographic printing method which requires no alkali developer in platemaking, achieves high resolution, creates a clear distinction between an image area and a non-image area to furnish a printing surface with excellent image quality, and allows the printing plate precursor to be used repeatedly.

As a result of extensive investigation, the present inventors have recognized the phenomenon that titanium oxide and zinc oxide change their surface properties to hydrophilic properties on being irradiated with light and the phenomenon that the surface properties after the light-induced change are restored to the original condition by heat treatment. They have found that the above objects are accomplished by applying the former phenomenon to platemaking and the latter phenomenon to regeneration of a used printing plate. The present invention has been completed based on this finding.

The present invention provides:

(1) A lithographic printing method comprising repetition of the steps of:

exposing a printing plate precursor having on the surface thereof a thin layer comprising $TiO_2$, ZnO or at least one compound selected from the group consisting of $RTiO_3$ wherein R represents an alkaline earth metal atom, $AB_{2-x}C_xD_{3-x}E_xO_{10}$ wherein A represents a hydrogen atom or an alkali metal atom; B represents an alkaline earth metal atom or a lead atom; C represents a rare earth atom; D represents a metal atom of the group 5A of the Periodic Table; E represents a metal atom of the group 4A of the Periodic Table; and x represents a number of from 0 to 2, $SnO_2$, $Bi_2O_3$, and $Fe_2O_3$ to active light to make the exposed area hydrophilic, and making the hydrophilic area hydrophobic by heat treatment.

(2) The lithographic printing method described in (1) above, wherein the printing plate precursor is imagewise exposed to active light, the exposed side is brought into contact with printing ink to form a printing surface the image area of which has received the ink to carry out lithographic printing, and after the printing, the printing surface is cleaned to remove any residual ink, and the printing plate precursor is repeatedly used for printing.

(3) The lithographic printing method described in (1) above, wherein the entire surface of the printing plate precursor is exposed to active light, an image is drawn in a heat mode to obtain a printing plate, and the printing plate is brought into contact with printing ink to form a printing surface the image area of which has received the ink to carry out printing, and after printing, the printing surface is cleaned to remove any residual ink, and the printing plate precursor is repeatedly used for printing.

(4) The lithographic printing method described in (2) or (3) above, wherein the printing plate precursor after printing is heated at 80° C. or higher before reuse.

(5) The lithographic printing method described in any one of (1) to (3) above, wherein the thin layer described in (1) is formed on the surface of a plate cylinder of a lithographic printing machine.

(6) A lithographic printing plate precursor having on the printing side thereof the thin layer described in (1), the printing plate being used in the lithographic printing method described in any one of (1) to (5) above.

The present invention also includes embodiments in which:

(7) The printing plate precursor with the thin layer is provided with a hydrophilic image, and the entire surface of the printing plate precursor is exposed to active light. The image area is brought into contact with printing ink to form a printing surface the image area of which has received the ink. The printing surface is brought into contact with a printing substrate to carry out printing.

(8) The overall exposure to active light is followed by imagewise removal of the hydrophilic substance, and the area from which the image substance has been removed is brought into contact with printing ink.

(9) The ink remaining on the printing surface of the used printing plate and the image substance, if any remains, are cleaned off, and the plate is heated to 80° C. or higher for regeneration.

(10) The printing plate precursor with the thin layer is provided with a lipophilic image, and the non-image area is irradiated with active light all over. The resulting printing plate is brought into contact with printing ink to form a printing surface the image area of which has received the ink, which is brought into contact with a printing substrate to carry out printing.

(11) The ink remaining on the printing surface of the used printing plate and the lipophilic image substance, if any remains, are cleaned off, and the plate is heated to 80° C. or higher for regeneration.

DETAILED DESCRIPTION OF THE INVENTION

The characteristics of the present invention consist in (1) the discovery that a thin film comprising at least one metal oxide selected from the group consisting of $RTiO_3$ (wherein R is as defined above), $AB_{2-x}C_xD_{3-x}E_xO_{10}$ (wherein A, B, C, D, E, and x are as defined above), $SnO_2$, $Bi_2O_3$, and $Fe_2O_3$, changes its surface hydrophilic/lipophilic properties on receipt of active light and is restored to its original surface condition by heat application and (2) application of this discovery to distinction between ink receptivity and ink repellency, thereby establishing a technique of producing a lithographic printing plate and a technique of regenerating a used printing plate.

In what follows, the above-described specific metal oxides will be referred to as photocatalyzed metal oxides. The term "active light" as used herein denotes light which is absorbed by a photocatalyzed metal oxide to excite the photocatalyzed metal oxide to make the surface hydrophilic. The light source, wavelength, etc. of such active light will be described later. The term "imagewise exposure" as used herein means exposure to light modulated so that the illumination intensity may be distributed imagewise at the image plane. The term "thin film" is equivalent to the term "thin layer".

The term "overall exposure" means that the entire surface of a printing plate precursor is irradiated with light substantially uniformly, i.e., with practically no local non-uniformity being observed. The term "heat mode" as used herein is intended to mean what is meant in the art, including a mode in which a temperature is elevated imagewise by contact with a fine heating element and a mode in which absorbed light is converted to heat energy not to cause a photochemical change but a thermal change.

It is well known that titanium oxide and zinc oxide possess photosensitivity. In particular, zinc oxide gives an electrostatic latent image on light irradiation in a charged state or with a voltage applied, which has been put to practical use in electrostatic photography as an electrofax. However, the fact that these substances change their surface hydrophilic/lipophilic properties on light irradiation is a finding made apart from the above-described photoelectric charge generation. The phenomenon was not noted in those days when the studies were directed to application of photosensitivity of titanium oxide and zinc oxide to electrophotography. The concept of the present invention which resides in application of the phenomenon to lithographic printing is quite new.

In the present invention either titanium oxide or zinc oxide serves as a photosensitive material. Titanium oxide is preferred to zinc oxide for its sensitivity, namely, changeability of surface properties by light. Titanium oxide to be used is not limited by process of production, and any species prepared by known methods, such-as calcination of ilmenite or titanium slag in the presence of sulfuric acid or chlorination of these raw materials under heat followed by oxidation with oxygen. A vacuum deposited oxide film using metallic titanium as an evaporation source is also useful as a photosensitive layer.

The printing plate precursor having a titanium oxide (or zinc oxide)-containing surface layer can be prepared by, for example, (1) coating a printing plate material with a dispersion of titanium oxide (or zinc oxide) crystallites, (2) baking the coating layer obtained above to reduce or remove the binder, (3) depositing titanium oxide (or zinc oxide) on a printing plate material by vacuum evaporation, or (4) coating a printing plate material with an organotitanium (or organozinc) compound, such as titanium butoxide, followed by oxidatively calcining the coating compound into titanium oxide (or zinc oxide). A titanium oxide layer provided by vacuum deposition is particularly preferred.

The above-described methods (1) and (2) include an embodiment in which a dispersion of amorphous titanium oxide crystallites is applied, followed by calcining to form an anatase or rutile crystal layer, an embodiment in which a mixed dispersion of titanium oxide and silicon oxide is applied to form a surface layer, and an embodiment in which a mixture of titanium oxide and an organopolysiloxane or a monomer thereof is applied. The titanium oxide crystallites may be applied as dispersed in a binder resin that can coexist in the oxide layer. A wide range of polymers having dispersibility for oxide powder can be employed as a binder resin. Hydrophobic binder resins, such as polyalkylenes (e.g., polyethylene), polybutadiene, polyacrylates, polymethacrylates, polyvinyl acetate, polyvinyl formate, polyethylene terephthalate, polyethylene naphthalate, polyvinyl alcohol, partially saponified polyvinyl alcohol, and polystyrene, are preferred. These resins can be used either individually or as a mixture thereof.

The vacuum deposition of titanium oxide according to the method (3) is usually carried out by putting metallic titanium on a heat source in a vacuum chamber of a vacuum deposition apparatus and evaporating the metal under a degree of vacuum of exp (−5 to −8) Torr at a total gas pressure of exp (−2 to −5) Torr and an oxygen partial pressure ratio of 30 to 90% to form a thin deposit film of titanium oxide on a substrate.

The zinc oxide layer is preferably formed by a method comprising electrolytically oxidizing the surface of a metallic zinc plate to form an oxide film and the method (3). A deposit film of zinc oxide can be formed by evaporating metallic zinc in the presence of oxygen gas in the same manner as described above for vacuum deposition of titanium oxide or by depositing a metallic zinc film in the absence of oxygen followed by heating at about 700° C. in air to oxidize the zinc film.

The deposit film of titanium oxide or zinc oxide preferably has a thickness of 1 to 100,000 Å, particularly 10 to 10,000 Å. A deposit thickness of 3,000 Å or less is still preferred for preventing distortion due to light interference. It is preferred for the deposit film to have a thickness of at least 50 Å in order to draw the photoactivating effect sufficiently.

While any crystal form of titanium oxide can be used, an anatase crystal form is preferred for its higher sensitivity. As is well known, anatase can be obtained by a proper choice of calcining conditions. The titanium oxide in the surface layer may comprise amorphous titanium oxide or rutile, but it is desirable for the layer to have an anatase content of 40% or more, particularly 60% or more, based on the total titanium oxide for the above reason.

The layer consisting mainly of titanium oxide or zinc oxide preferably comprises at least 30% by volume, preferably at least 50% by volume, of titanium oxide or zinc oxide. If the volumetric proportion of the oxide is lower than 30%, the sensitivity in changing the surface properties on light irradiation is reduced. A continuous phase containing no binder, i.e., a layer practically comprising 100% by volume of the oxide is the most preferred. However, because the purity is not so influential on the character of changing the surface hydrophilic/lipophilic properties as on the photoelectric effect for use as an electrophotographic photosensitive layer, a purity close to 100% (e.g., 98%) would be enough. This will be understood from the fact that the purpose is to obtain the character of the surface's changing between hydrophilic properties and lipophilic properties, which is a discrete character independent on electrical conductivity.

In some cases doping of the oxide layer with a certain kind of metal is effective in enhancing the character of the surface's changing the hydrophilic properties on light irradiation. Dopant metals having a small ionizing tendency meet this purpose. Preferred dopant metals include Pt, Pd, Au, Ag, Cu, Ni, Fe, and Co, and a combination of two or more thereof.

The active light which can be used in the present invention to excite the thin layer comprising mainly of titanium oxide or zinc oxide is light having wavelengths to which the oxide is sensitive. The photosensitive region of anatase, rutile, and zinc oxide being 387 nm or less, 413 nm or less, and 387 nm or less, respectively, useful light sources include a mercury lamp, a tungsten halogen lamp, other metal halide lamps, a xenon lamp, and the like. A helium-cadmium laser having an oscillation wavelength of 325 nm and an argon laser having an oscillation wavelength of 351.1 to 363.8 nm are also applicable as a light source. An InGaN quantum well semiconductor laser having an oscillation wavelength of 360 to 440 nm, which belongs to GaN lasers which have been confirmed to oscillate in the near ultraviolet region, and a waveguide MgO-$LiNbO_3$ inverted domain wavelength conversion device type laser having an oscillation wavelength of 360 to 430 nm are also useful.

Where formation of a lipophilic image area is preceded by uniform overall exposure of the printing plate precursor to active light to make the entire surface hydrophilic, the overall exposure can be carried out by a planar exposure system (a system for exposing the entire surface at a time), a full exposure system using a line focus of light through a moving slit, or a beam scanning exposure system using a beam of light. The beam scanning exposure system can be regarded as a full exposure system as far as the scanning interval is small enough to assure practical printability. In general a beam scanning exposure system is advantageous in using a laser light source, and a planar exposure system is advantageous in using an ion-coherent light source of dispersion type, such as a bulb or a discharge tube.

A lipophilic image area can be formed on the printing plate precursor having been rendered uniformly hydrophilic by imagewise heating the hydrophilic surface. Imagewise heating can be carried out by using a thermal head or a photothermal conversion head (a head capable of converting light to heat) or by irradiation with heat rays through a mask. The imagewise heating with a thermal head is typically performed by bringing a fine heating element into contact with the hydrophilic surface. Imagewise exposure to heat rays can be effected either by a scanning system (a beam lithography system) or a planar exposure system (flash exposure or slit exposure through a heat ray-impermeable mask). An infrared light source is particularly preferred for the scanning system, and a scanning exposure system using an infrared laser beam can be used. The infrared light source is also preferred for the planar exposure system, and an infrared lamp is particularly preferred. Exposure may also be effected by a high intensity flash exposure system in which electricity stored in a high-dielectric constant capacitor is released at a time.

A suitable exposure is 0.05 to 10 joule/$cm^2$, preferably 0.05 to 5 joule/$cm^2$.

The heat mode drawing by contact with a heating element is preferably carried out by printing with a thermal head used in printers of heat-sensitive recording system.

The aforementioned photosensitivity causing light-induced change from hydrophobic properties to hydrophilic properties differs from that observed with zirconia ceramics as disclosed in JP-A-9-169098 in terms of both character and mechanism. More specifically, the publication mentions that zirconia ceramics are sensitive to a laser beam of 7 W/$\mu m^2$, which corresponds to 70 joule/$cm^2$ taking the pulse duration of a laser beam as 100 nsec. The sensitivity on that level is lower than the sensitivity of the titanium oxide layer of the present invention by about one figure. As for the mechanism, while it has not yet been made clear, the photosensitivity observed in the present invention is considered to be a photo-induced release reaction of some lipophilic organic matter from the oxide layer, which is different from the photofunctional mechanism of zirconia anyway.

Upon formation of a lipophilic image area by heat mode drawing, the printing plate precursor having its titanium oxide or zinc oxide surface layer made hydrophilic by overall exposure turns to a lithographic printing plate which can be sent directly to a lithographic printing stage without a developing processing. Therefore, compared with conventional lithographic printing methods, the printing method of the present invention enjoys many advantages primarily consisting in simplification of platemaking. That is, no chemical treatment with an alkali developer is needed; operations following a chemical treatment, such as wiping and brushing, are not involved; and an environmental load due to discharge of a waste developer is eliminated.

If desired, a zinc oxide layer can be subjected to spectral sensitization in a conventional manner. In such cases, too, the above-mentioned light sources are useful. In addition, light sources having an emission spectrum in the spectral sensitization region, such as a tungsten lamp, can also be employed.

The printing plate precursor having a thin layer of other photocatalyzed metal oxides can be prepared by, for example, (1) coating a printing plate material with a dispersion of fine particles of the metal oxide, (2) baking the coating layer obtained above to reduce or remove the binder, (3) forming a thin film of the metal oxide on a printing plate material by a vacuum thin film formation method, (4) coating a printing plate material with an organometallic compound, such as a metal alcoholate, followed by hydrolysis, and followed by oxidative calcination to form a metallic thin film having an appropriate thickness or (5) spraying an aqueous solution of a hydrochloride, nitrate, etc. containing the metal under heat. A titanium oxide layer provided by vacuum deposition is particularly preferred.

For example, a layer comprising titanium barium particles can be provided by the above-described method (1) or (2) in which a mixed dispersion of barium titanate and silicone or a mixture of barium titanate and an organopolysiloxane or a monomer thereof is applied to a printing plate material. The oxide may be applied as dispersed in a binder resin that can coexist in the oxide layer. A wide range of polymers having dispersibility for barium titanate powder can be employed as a binder resin. Hydrophobic binder resins, such as polyalkylenes (e.g., polyethylene), polybutadiene, polyacrylates, polymethacrylates, polyvinyl acetate, polyvinyl formate, polyethylene terephthalate, polyethylene naphthalate, polyvinyl alcohol, partially saponified polyvinyl alcohol, and polystyrene, are preferred. These resins can be used either individually or as a mixture thereof. A thin film comprising magnesium titanate, calcium titanate, strontium titanate or an intermolecular compound thereof or a mixture thereof can be formed similarly.

A layer comprising fine particles of $CsLa_2NbTi_2O_{10}$ can also be provided by the methods (1) and (2). In this case, theoretical amounts of $Cs_2CO_3$, $La_2O_3$, $NbO_5$, and $TiO_2$ are finely ground in a mortar, put in a platinum crucible, and fired at 130° C. for 5 hours to produce $CsLa_2NbTi_2O_{10}$. After cooling, the mixed powder is put in a mortar and pulverized to several microns or even smaller particles. The resulting particles are dispersed in the above-described binder and applied to a printing plate material to form a thin layer. A thin layer comprising other complex metal oxides $AB_{2-x}C_xD_{3-x}E_xO_{10}$ ($0 \leqq x \leqq 2$), such as $HCa_{1.5}La_{0.5}Nb_{2.5}Ti_{0.5}O_{10}$ and $HLa_2NbTi_2O_{10}$ can be provided similarly.

The vacuum thin film formation method (3) usually includes sputtering and vacuum deposition. In carrying out sputtering a target comprising a simple substance or a binary oxide is prepared.

For example, a crystalline barium titanate thin film is formed by RF sputtering using a barium titanate target in an argon/oxygen mixed gas at a substrate temperature of 450° C. or higher. The crystallinity is controlled by post-annealing at 300 to 900° C. according to necessity. A thin layer comprising $RTiO_3$ (R: alkaline earth metal atom) or other photocatalyzed metal oxides can be formed in the same manner by selecting an optimal substrate temperature for crystallinity control. For example, a crystalline tin oxide thin film is formed by RF sputtering in an argon/oxygen (50/50 by mole) mixed gas at a substrate temperature of 120° C. and an RF power of 200 W.

The method (4) is also a film formation method using no binder. For example, a barium titanate thin film is formed by coating a silicone substrate having $SiO_2$ on the surface thereof with a mixed solution of barium ethoxide and titanium butoxide in an alcohol solvent, hydrolyzing the coating layer, and baking the surface at 200° C. or higher. This method is also applicable to other photocatalyzed metal oxide layers comprising $RTiO_3$, $AB_{2-x}C_xD_{3-x}E_xO_{10}$ (wherein A, B, C, D, E, and x are as defined above), $SnO_2$, $Bi_2O_3$ or $Fe_2O_3$.

The method (5) is also a film formation method using no binder. For example, a $SnO_2$ thin film is formed by spraying a solution of $SnCl_4$ in an aqueous hydrochloric acid solution onto a substrate comprising quartz or crystalline glass heated to 200° C. or higher. This method is applicable to the formation of other photocatalyzed metal oxide layers comprising $RTiO_3$, $AB_{2-x}C_xD_{3-x}E_xO_{10}$ (wherein A, B, C, D, E, and x are as defined above), $Bi_2O_3$ or $Fe_2O_3$.

The metal oxide thin layer, formed by any of the above-described methods, preferably has a thickness of 1 to 100,000 Å, particularly 10 to 10,000 Å. A thickness of 3,000 Å or less is still preferred for preventing distortion due to light interference. It is preferred for the thin layer to have a thickness of at least 50 Å in order to draw the photoactivating effect sufficiently.

The proportion of the photocatalyzed metal oxide in the thin layer should be 50 to 100% by volume, preferably 90% by volume or more. A continuous phase containing no binder, i.e., a layer practically comprising 100% by volume of the oxide is the most preferred.

In some cases doping of the oxide layer with a certain kind of metal is effective in enhancing the character of the surface's changing the hydrophilic properties on light irradiation. Dopant metals having a small ionizing tendency meet this purpose. Preferred dopant metals include Pt, Pd, Au, Ag, Cu, Ni, Fe, and Co, and a combination of two or more thereof.

The printing plate according to the present invention can be used in various embodiments. For example, a photocatalyzed metal oxide layer can be directly provided on a plate cylinder of a printer by the above-described vapor deposition, dipping or coating to prepare a printing plate precursor, or a metal plate on which a photocatalyzed metal oxide layer is provided can be put around a plate cylinder to prepare a printing plate precursor. The metal plate preferably includes an aluminum plate, a stainless steel plate, a nickel plate and a copper plate. A flexible metal plate and a flexible plastic support made of polyester or a cellulose ester are also useful. Waterproof paper, polyethylene-laminated paper or impregnated paper can also serve as a support on which the oxide layer is formed to provide a printing plate precursor.

Where the oxide layer is formed on a support, the support to be used is sheeting having dimensional stability, such as paper, resin-laminated paper (e.g., polyethylene-, polypropylene- or polystyrene-laminated paper), a plate of metal (e.g., aluminum, zinc, copper, stainless steel), plastic films (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinyl acetal), paper or plastic films having the above metal laminated or deposited thereon.

Of these supports preferred are a polyester film, an aluminum plate, and a SUS plate having anticorrosion on an printing machine. An aluminum plate, which has dimensional stability and is relatively cheap, is especially preferred. Suitable aluminum plates include a pure aluminum plate and a plate of aluminum-based alloys containing small amounts of different elements. Aluminum-laminated or deposited plastic films are also preferred. The different elements providing aluminum alloys include silicon, iron, manganese, copper, magnesium, chromium, zinc, bismuth, nickel, and titanium. The content of these different elements in the alloy is 10% by weight at the most. The most ideal aluminum support for use in the present invention is a pure aluminum plate. Since 100% pure aluminum is difficult to produce with the state-of-the-art refining techniques, nearly pure aluminum with a trace of different elements will do. Thus, the aluminum plate to be used in the present invention is not particularly limited by composition, and aluminum plates made of conventional known materials can be utilized appropriately. The thickness of the support which can be used in the present invention is usually about 0.1 to 0.6 mm, preferably 0.15 to 0.4 mm, still more preferably 0.2 to 0.3 mm.

If desired, the aluminum plate is subjected to degreasing (removal of rolling oil) with a surface active agent, an organic solvent, an aqueous alkali solution, etc. prior to surface graining.

Surface graining of the aluminum plate can be carried out by various methods, for example, mechanical graining, electrochemical surface dissolution, or selective chemical surface dissolution. Mechanical graining is conducted in a known manner, for example, by ball polishing, brush polishing, blasting or buffing. Electrochemical graining can be carried out in a hydrochloric acid or nitric acid electrolytic solution with an alternating or direct current applied. A combination of mechanical graining and electrochemical graining can be used as taught in JP-A-54-63902.

If desired, the grained aluminum plate is subjected to etching with an alkali and neutralization. The plate can then be anodized to acquire increased water-receptivity and wear resistance. The electrolyte to be used in anodizing can be anything capable of forming a porous oxide layer, usually sulfuric acid, hydrochloric acid, oxalic acid, chromic acid or a mixture thereof. The electrolyte concentration depends on the kind.

Variable according to the kind of the electrolyte, anodizing conditions are not generally specified. Anodizing is usually carried out at an electrolyte concentration of 1 to 80% by weight, a liquid temperature of 5 to 70° C., a current density of 5 to 60 A/dm$^2$, a voltage of 1 to 100 V, and for an electrolysis time of 10 seconds to 5 minutes.

The anodized layer is preferably formed to an amount (depth) of 1.0 g/m$^2$ or more. If the amount of the anodized layer is less than 1.0 g/m$^2$, the resulting lithographic printing plate tends to have an insufficient press life or easily receives scratches on its non-image area, to which ink adheres.

The printing plate precursor having a photocatalyzed metal oxide surface layer is essentially lipophilic and accepts ink but, on being imagewise exposed to light, the irradiated area turns hydrophilic, i.e., water-wettable and repels ink. When the exposed printing plate precursor is brought into contact with printing ink, the image area receives the ink, with the non-image area holding a fountain solution, to compose a printing surface. Printing is then performed by bringing the printing surface thus formed into contact with a printing substrate to transfer the ink to the printing substrate.

The change between hydrophilic properties and lipophilic properties induced by light irradiation, which is the foundation of the instant invention, is extremely noticeable. The greater the difference between the hydrophilic properties of the non-image area and the lipophilic properties of the image area, the more outstanding the distinction, furnishing a clearer printing surface with a longer press life as well. The difference between hydrophilic properties and lipophilic properties can be expressed in terms of a contact angle with a water drop. As the hydrophilic properties become greater, a water drop spreads to have a smaller contact angle. Conversely, on the lipophilic (i.e., water-repellent) area, the contact angle is greater. In other words, the printing plate precursor having a photocatalyzed metal oxide surface layer essentially has a great contact angle with water but drastically reduces the contact angle on receipt of active light, turning repellent against lipophilic ink, whereby there is formed a printing surface having an image composed of an ink-holding area and a water-holding area. On contact with an image-receiving sheet, such as paper, the ink is transferred to the image-receiving sheet.

A preferred intensity of the active light varies depending on the properties of the image-forming photocatalyzed metal oxide layer. Because the contact angle decreases with an increase in quantity of light, a preferred intensity of light also depends on the desired level of distinction between image and non-image areas. In general, the planar exposure intensity before modulation is 0.05 to 100 joule/cm$^2$, preferably 0.2 to 10 joule/cm$^2$, still preferably 0.5 to 5 joule/cm$^2$, for photocatalyzed metal oxides.

The effect of light irradiation substantially follows the reciprocity law. For example, an exposure of 10 mW/cm$^2$× 10 seconds and an exposure of 1 W/cm$^2$×1 second are equal in effect. Accordingly, no restriction is imposed on the choice of a light source as long as active light is emitted.

The aforementioned photosensitivity of titanium oxide or zinc oxide differs from that observed with zirconia ceramics as disclosed in JP-A-9-169098 in terms of both character and mechanism. More specifically, the publication mentions that zirconia ceramics are sensitive to a laser beam of 7 $W/cm^2$, which corresponds to 70 $joule/cm^2$ taking the pulse duration of a laser beam as 100 nsec. The sensitivity on that level is lower than the sensitivity of the titanium oxide or zinc oxide layer of the present invention by about one figure. As for the mechanism, while it has not yet been made clear, the photosensitivity of the titanium oxide or zinc oxide layer is considered to be a photo-induced release reaction of some lipophilic organic matter from the oxide layer, which is different from the photofunctional mechanism of zirconia anyway.

After imagewise exposure of the photocatalyzed metal oxide surface layer, the printing plate precursor of the present invention can be turned into a lithographic printing plate which can be sent directly to a lithographic printing stage without a developing processing. Therefore, the printing method of the present invention enjoys many advantages primarily consisting in simplification of platemaking. That is, no chemical treatment with an alkali developer is needed; operations following a chemical treatment, such as wiping and brushing, are not involved; and an environmental load due to discharge of a waste developer is eliminated.

While the lithographic printing plate thus obtained exhibits sufficient water-wettability on its exposed area, i.e., the non-image area, the non-image area may further be subjected to a post-treatment with washing water, a rinsing solution containing a surface active agent, etc., or a desensitizing solution containing gum arabic, a starch derivative, etc. These post-treatments can be combined appropriately. For example, the above-described burning conditioner is applied to the printing plate with impregnated sponge or cotton wad or by means of an automatic coater, or immersing the plate in the burning conditioner. Better results can be obtained by leveling the surface with a squeegee or a squeegee roll after the application. A suitable amount of the burning conditioner to be applied is usually from 0.03 to 0.8 $g/m^2$ on a dry basis. The lithographic printing plate thus post-treated is mounted on a lithographic printing machine, etc. and used for producing a great number of prints.

After completion of printing, the printing plate can be regenerated for reuse as follows. The ink adhered to the plate is washed off with a hydrophobic petroleum solvent. Commercially available aromatic hydrocarbon solvents for dissolving printing ink, such as kerosine and Isopar, can be made use of. In addition, benzole, toluol, xylol, acetone, methyl ethyl ketone, and mixtures thereof are also useful.

The ink-free printing plate is then subjected to a heat treatment to make the entire surface thereof uniformly lipophilic and thereby to restore the photosensitivity, i.e., changeability to hydrophilic properties on light irradiation. The heat treatment is carried out at a temperature of 80° C. or higher, preferably 100° C. or higher, and up to the calcining temperature of photocatalyzed metal oxide. The higher the temperature, the shorter the time required for turning lipophilic. Still preferred heating conditions are 150° C. for 10 minutes or longer, 200° C. for 1 minute or longer, or 250° C. for 10 seconds or longer. An extended heating time has no adverse influences, but once the surface hydrophilic properties are restored, an excessive extension of a heating time produces no advantage.

The heat source for regeneration is arbitrarily selected from those meeting the above-described heating conditions. Suitable heating means include direct radiant heating with infrared rays, indirect infrared heating with a heat ray-absorbing sheet, such as black carbon paper, in contact with the printing surface, heating in a thermostat having a set temperature, contact heating with a hot plate or any other heating plates, and contact with a heat roller.

The printing plate precursor thus regenerated from a used printing plate is stored under protection against exposure to active light for another printing procedure.

Although the inventors have not completely confirmed the permissible maximum number of times of regeneration of a printing plate into a printing plate precursor, it is at least 15 times as demonstrated in Examples hereinafter given. It seems that the permissible number of times of regeneration will be limited by unremovable stains, scratches beyond repair in practice, or mechanical deformation of the plate material.

The present invention will now be illustrated in greater detail with reference to Examples, but it should be understood that the present invention is not construed as being limited thereto. Unless otherwise noted, all the percents are by weight.

In Examples, a contact angle was measured by an water drop in air method with CONTACT-ANGLE METER CA-D manufactured by Kyowa Kaimen Kagaku K.K.

EXAMPLE 1

A piece of metallic titanium was put in a vacuum deposition apparatus and evaporated and deposited on a 100 μm thick stainless steel plate to form a deposit film of titanium dioxide at a degree of vacuum of $1.5\times10^{-4}$ Torr in the atmosphere having an oxygen partial pressure of 70%. X-ray analysis on the crystal components of the resulting thin film revealed that the amorphous crystals/anatase/rutile ratio was 1.5/6.5/2. The thickness of the deposit film was 900 Å. A sample of 510×400 mm was cut out of the $TiO_2$-deposited stainless steel plate. A lith film original having a resolution of 400 lines/in. and having formed a positive image was put on the sample and brought into intimate contact therewith mechanically with a quartz glass plate put thereon. The sample was exposed to light through the lith film at a light intensity of 9 $mW/cm^2$ for 2 minutes by means of an exposuring light source, UNIREC URM-600, Model GH-60201X, manufactured by Ushio Inc. The contact angle was 6° on the exposed area and 79° on the unexposed area.

The resulting printing plate was set on a one-side press, Oliver 52 manufactured by Sakurai K.K., and lithographic printing was carried out to obtain 500 prints using pure water as a fountain solution and Newchampion F Gloss 85 Sumi produced by Dainippon Ink & Chemicals, Inc. as printing ink. As a result, clear prints were obtained from the start to the end, and no scratches were observed on the printing plate.

The printing surface of the printing plate was cleaned carefully and thoroughly to remove the residual ink with soft cloth impregnated with a printing ink cleaner, Dai-clean R (available from Dainippon Inks & Chemicals, Inc.). The plate was heated in an oven at 150° C. for 10 minutes. After allowing the plate to cool to room temperature, the contact angle was measured. It was found within the range of from 78° to 80° at every site of measurement, indicating that the plate surface had restored its pre-exposure original state.

The thus regenerated printing plate precursor was again exposed to light under the same conditions as in the first exposure except for using a lith film having a positive image different from that used in the first exposure. Similarly to the results of the first exposure, the contact angle was 6° on the exposed area and 79° on the unexposed area. Lithographic printing was carried out to obtain 500 prints by using the resulting printing plate in the same manner as in the first printing. Clear prints were obtained from the start to the end, and no scratches were observed on the printing plate.

When the above-described procedure for regeneration of the used printing plate, imagewise exposure, and printing were repeated 15 times, there was observed no change in photosensitivity, contact angle, and speed of restoration of contact angle by heating.

EXAMPLE 2

A 0.30 mm thick rolled plate of JIS A1050 aluminum material comprising 99.5% aluminum, 0.01% copper, 0.03% titanium, 0.3% iron, and 0.1% silicon was grained with a 20% aqueous suspension of pumice stone (400 mesh), produced by Kyoritsu Ceramic Materials Co., Ltd., and a rotating nylon brush (made of nylon 6,10), followed by thoroughly washing with water.

The grained aluminum plate was etched by immersion in a 15% sodium hydroxide aqueous solution previously containing 4.5% aluminum to dissolve 5 $g/m^2$ of aluminum, followed by washing with running water. After neutralization with 1% nitric acid, the surface of the plate was electrolytically grained in a 0.7% aqueous nitric acid solution previously containing 0.5% aluminum by applying a square wave alternating voltage (current ratio r: 0.90, the current wave form is disclosed in Japanese Patent Publn. No. 58-5796) under conditions of 10.5 V in anode potential, 9.3 V in cathode potential, and 160 $C/dm^2$ in quantity of anode electricity. After washing with water, the plate was etched by soaking in a 10% aqueous solution of sodium hydroxide at 35° C. to dissolve 1 $g/m^2$ of aluminum, followed by washing with water. The plate was desmutted by immersing in a 30% sulfuric acid aqueous solution at 50° C. and washed with water.

The plate was anodized in a 20% sulfuric acid aqueous solution at 35° C. previously containing 0.8% aluminum by applying a direct current at a current density of 13 $A/dm^2$ to form a porous anodized layer. The electrolysis time was adjusted to form the anodized layer to a depth of 2.7 $g/m^2$. After washing with water, the plate was then immersed in a 3% sodium silicate aqueous solution at 70° C. for 30 seconds, washed with water, and dried.

The resulting aluminum support had a reflection density of 0.30 as measured with a Macbeth reflection densitometer, RD920, and an average center-line surface roughness of 0.58 $\mu$m.

Then, the aluminum support was placed in a vacuum deposition apparatus and heated to 200° C. After evacuating the chamber to a degree of vacuum of $1.0\times10^{-6}$ Torr, titanium oxide was heated with an electron beam under an oxygen partial pressure of $1.5\times10^{-4}$ Torr to form a titanium dioxide deposit film on the aluminum support. X-ray analysis on the crystal components of the resulting film revealed that the amorphous crystals/anatase/rutile ratio was 2.5/4.5/3. The thickness of the deposit film was 750 Å. A sample of 510×400 mm was cut out of the $TiO_2$-deposited aluminum plate. A lith film original having formed a positive image was put on the sample and brought into intimate contact therewith mechanically with a quartz glass plate put thereon. The sample was exposed to light through the lith film at a light intensity of 9 $mW/cm^2$ for 2 minutes by means of an exposuring light source, UNIREC URM-600, Model GH-60201X, manufactured by Ushio Inc. The contact angle was5° on the exposed area and 80° on the unexposed area.

The resulting printing plate was set on a one-side press, Oliver 52 manufactured by Sakurai K.K., and lithographic printing was carried out to obtain 1000 prints using pure water as a fountain solution and Newchampion F Gloss 85 Sumi produced by Dainippon Ink & Chemicals, Inc. as printing ink. As a result, clear prints with no stain on the non-image area were obtained from the start to the end. No scratches were observed on the printing plate.

The surface of the printing plate was cleaned carefully and thoroughly to remove the residual ink with soft cloth impregnated with a printing ink cleaner, Dai-clean R (available from Dainippon Inks & Chemicals, Inc.). The plate was heated in an oven at 180° C. for 2 minutes. After allowing the plate to cool to room temperature, the contact angle was measured. It was found within the range of from 78° to 80° at every site of measurement, indicating that the plate surface had restored its pre-exposure original state.

The thus regenerated printing plate precursor was again exposed to light under the same conditions as in the first exposure except for using a lith film having a positive image different from that used in the first exposure. Similarly to the results of the first exposure, the contact angle was 5° on the exposed area and 79° on the unexposed area. Lithographic printing was carried out to obtain 1000 prints by using the resulting printing plate in the same manner as in the first printing. Clear prints were obtained from the start to the end, and no scratches were observed on the printing plate.

When the above-described procedure for regeneration of the used printing plate, imagewise exposure, and printing were repeated 5 times, there was observed no change in photosensitivity, contact angle, and speed of restoration of contact angle. It was thus proved that a printing plate precursor comprising an aluminum support having formed thereon a titanium dioxide photosensitive layer enables simplified printing and can be used repeatedly.

EXAMPLE 3

A 100 $\mu$m thick SUS plate was set in a vacuum deposition apparatus, and zinc selenide was evaporation deposited on the SUS plate to a thickness of 1000 Å under vacuum of $5\times10^{-3}$ Torr. The deposit film was oxidized in air at 600° C. for 2 hours to form a thin film of zinc oxide.

The plate with the oxide layer was cut into a sample of 510×400 mm. A lith film original having formed a positive image was put on the sample and brought into intimate contact therewith mechanically with a quartz glass plate put thereon. The sample was exposed to light through the lith film at a light intensity of 9 $mW/cm^2$ for 2 minutes by means of an exposuring light source, UNIREC URM-600, Model GH-60201X, manufactured by Ushio Inc. The contact angle was 17° on the exposed area and 51° on the unexposed area.

The resulting printing plate was set on a one-side press, Oliver 52 manufactured by Sakurai K.K., and lithographic printing was carried out to obtain 500 prints using pure water as a fountain solution and Newchampion F Gloss 85 Sumi produced by Dainippon Ink & Chemicals, Inc. as printing ink. As a result, clear prints with no stain on the non-image area were obtained from the start to the end. No scratches were observed on the printing plate.

The surface of the printing plate was cleaned carefully and thoroughly to remove the residual ink with soft cloth impregnated with a printing ink cleaner, Dai-clean R (available from Dainippon Inks & Chemicals, Inc.). The plate was heated in an oven at 160° C. for 15 minutes. After allowing the plate to cool to room temperature, the contact angle was measured. It was found within the range of from 64° to 70° at every site of measurement, indicating that the plate surface had restored its pre-exposure original state.

The thus regenerated printing plate precursor was again exposed to light under the same conditions as in the first exposure except for using a lith film having a positive image different from that used in the first exposure. Similarly to the results of the first exposure, the contact angle was 15° on the exposed area and 68° on the unexposed area. Lithographic printing was carried out to obtain 1000 prints by using the resulting printing plate in the same manner as in the first printing. Clear prints were obtained from the start to the end, and no scratches were observed on the printing plate. It was thus proved that a printing plate precursor having a zinc oxide photosensitive layer also creates a distinction between an ink-receptive area and a water-wettable area, achieving simplification of platemaking, and can be regenerated by a heat treatment.

EXAMPLE 4

A 200 μm thick SUS plate was grained with a mixture of an abrasive (FO#4000, produced by Fujimi Corp.) and water. The resulting surface roughness was 5 μm in average as measured with a three-dimensional surface roughness meter (Model SE-F1, DU-RJ2U, manufactured by Kosaka Kenkyusho; analyzer: Model SPA-11).

After washing with water and drying, the surface-grained plate was dipped in a 10% methanol solution of titanium butoxide (a product of Merck), pulled out, and dried spontaneously. The SUS plate was then treated in an electric oven set at 600° C. for 2 hours. Formation of a titanium oxide (anatase) layer having a thickness of 1500 Å on the surface was confirmed by X-ray analysis.

A lith film original having formed a positive image was put on the sample and brought into intimate contact therewith mechanically with a quartz glass plate put thereon. The sample was exposed to light through the lith film at a light intensity of 9 mW/cm$^2$ for 2 minutes by means of an exposuring light source, UNIREC URM-600, Model GH-60201X, manufactured by Ushio Inc. The contact angle was 2° on the exposed area and 71° on the unexposed area.

The resulting printing plate was set on a one-side press, Oliver 52 manufactured by Sakurai K.K., and lithographic printing was carried out to obtain 500 prints using pure water as a fountain solution and Newchampion F Gloss 85 Sumi produced by Dainippon Ink & Chemicals, Inc. as printing ink. As a result, clear prints with no stain on the non-image area were obtained from the start to the end. No scratches were observed on the printing plate.

The surface of the printing plate was cleaned carefully and thoroughly to remove the residual ink with soft cloth impregnated with a printing ink cleaner, Dai-clean R (available from Dainippon Inks & Chemicals, Inc.). The plate was heated in an oven at 180° C. for 2 minutes. After allowing the plate to cool to room temperature, the contact angle was measured. It was found within the range of from 68° to 72° at every site of measurement, indicating that the plate surface had restored its pre-exposure original state.

The thus regenerated printing plate precursor was again exposed to light under the same conditions as in the first exposure except for using a lith film having a positive image different from that used in the first exposure. Similarly to the results of the first exposure, the contact angle was 2° on the exposed area and 70° on the unexposed area. Lithographic printing was carried out to obtain 1000 prints by using the resulting printing plate in the same manner as in the first printing. Clear prints were obtained from the start to the end, and no scratches were observed on the printing plate. It was thus proved that a titanium oxide photosensitive layer provided on a SUS plate also achieves a distinction between an ink-receptive area and a water-wettable area, enabling simplified printing, and can be regenerated by a heat treatment.

EXAMPLE 5

A printing plate precursor was prepared in the same manner as in Example 1 and imagewise exposed to light of a water cooling type argon ion laser having a wavelength of 363.8 nm with the beam width condensed to 45 μm (1/e$^2$ value) under the following conditions.

Laser beam diameter: 45 μm (1/e$^2$)

Scanning speed: 1.51 m/sec

Scanning pitch: 22.5 μm

Energy density: 9.21 J/cm$^2$

The exposed sample was cut to a size of 510×410 mm. The contact angle of the sample was 79° on the unexposed area.

The resulting printing plate was set on a one-side press, Oliver 52 manufactured by Sakurai K.K., and lithographic printing was carried out to obtain 500 prints using pure water as a fountain solution and Newchampion F Gloss 85 Sumi produced by Dainippon Ink & Chemicals, Inc. as printing ink. As a result, clear prints were obtained from the start to the end, and no scratches were observed on the printing plate.

The surface of the printing plate was cleaned carefully and thoroughly to remove the residual ink with soft cloth impregnated with a printing ink cleaner, Dai-clean R (available from Dainippon Inks & Chemicals, Inc.). The plate was heated in an oven at 150° C. for 10 minutes. After allowing the plate to cool to room temperature, the contact angle was measured. It was found within the range of from 78° to 80° at every site of measurement, indicating that the plate surface had restored its pre-exposure original state.

The thus regenerated printing plate precursor was again exposed to light under the same conditions as in the first exposure except for using a lith film having a positive image different from that used in the first exposure. Similarly to the results of the first exposure, the contact angle on the unexposed area was 79°. Lithographic printing was carried out to obtain 500 prints by using the resulting printing plate in the same manner as in the first printing. Clear prints were obtained from the start to the end, and no scratches were observed on the printing plate.

When the above-described procedure for regeneration of the used printing plate, imagewise exposure, and printing were repeated 15 times, there was observed no change in photosensitivity, and contact angle on the unexposed area.

TEST EXAMPLE 1

The printing plate precursor prepared in Example 1, which had a titanium oxide surface layer, was exposed and then subjected to a heat treatment. Changes of contact angle on exposure and during the subsequent heat treatment were measured. The results obtained are shown in Table 1 below.

TABLE 1

| | | | Contact Angle (°) | | | | | | | |
|---|---|---|---|---|---|---|---|---|---|---|
| | | | Heating Time | | | | | | | |
| Before Exp. | After Exp. | Heating Temp. | 1 min | 5 mins | 10 mins | 15 mins | 1 hr | 2 hrs | 5 hrs |
| 77 | 5 | 130° C. | — | — | — | — | — | 62 | 77 |
| 70 | 7 | 200° C. | 50 | 53 | 65 | 67 | — | — | — |

As can be seen from Table 1, exposure induces extremely remarkable change from hydrophobic properties to hydrophilic properties, and the surface change can be restored to the original state by heating at 130° C. for about 2 hours or at 200° C. for several minutes.

EXAMPLE 6

An aluminum support was prepared in the same manner as in Example 2. The aluminum support was placed in a sputtering system. After evacuating the system to $5.0\times10^{-7}$ Torr, the support was heated to 500° C., and an argon/oxygen mixed gas (60/40 by mole) was introduced to $5\times10^{-3}$ Torr. An RF power of 200 W was applied to a sintered barium titanate target having a diameter of 6 in. to form a 1000 Å thick barium titanate thin film. The resulting thin film was proved polycrystalline by X-ray analysis. A sample of 510×400 mm was cut out of the $BaTiO_3$-deposited aluminum plate. A lith film original having formed a positive image of 400 lines/inch was put on the sample and brought into intimate contact therewith mechanically with a quartz glass plate put thereon. The sample was exposed to light through the lith film at a light intensity of 25 mW/cm$^2$ for 2 minutes by means of an exposuring light source, UNIREC URM-600, Model GH-60201X, manufactured by Ushio Inc. The contact angle was 7° on the exposed area and 54 to 56° on the unexposed area.

The resulting printing plate was set on a one-side press, Oliver 52 manufactured by Sakurai K.K., and lithographic printing was carried out to obtain 500 prints using pure water as a fountain solution and Newchampion F Gloss 85 Sumi produced by Dainippon Ink & Chemicals, Inc. as printing ink. As a result, clear prints were obtained from the start to the end. No scratches were observed on the printing plate.

The surface of the printing plate was cleaned carefully and thoroughly to remove the residual ink with soft cloth impregnated with a printing ink cleaner, Dai-clean R (available from Dainippon Inks & Chemicals, Inc.). The plate was heated in an oven at 150° C. for 10 minutes. After allowing the plate to cool to room temperature, the contact angle was measured. It was found within the range of from 54° to 57° at every site of measurement, indicating that the plate surface had restored its pre-exposure original state.

The thus regenerated printing plate precursor was again exposed to light under the same conditions as in the first exposure except for using a lith film having a positive image different from that used in the first exposure. Similarly to the results of the first exposure, the contact angle was 7° on the exposed area and 54° to 56° on the unexposed area. Lithographic printing was carried out to obtain 500 prints by using the resulting printing plate in the same manner as in the first printing. Clear prints were obtained from the start to the end, and no scratches were observed on the printing plate.

When the above-described procedure for regeneration of the used printing plate, imagewise exposure, and printing was repeated 15 times, there was observed no change in photosensitivity, contact angle, and speed of restoration of contact angle.

EXAMPLE 7

A $TiO_2$-deposited aluminum plate (printing plate precursor) was prepared in the same manner as in Example 2 and cut into a sample of 510×400 mm. The entire surface of the sample was exposed to light at a light intensity of 10 mW/cm$^2$ for 2 minutes by means of an exposuring light source, UNIREC URM-600, Model GH-60201X, manufactured by Ushio Inc. The contact angle was 5 to 7° C. at every site of measurement.

The hydrophilic $TiO_2$ surface layer was thermally recorded at a speed of 400 msec/m by use of a thermal printer having thermal heads (150 μm×150 μm in size, arrayed at 250 μm intervals) each comprising a Ta-$SiO_2$ heating resistor and a wear-resistant protective layer of a sialon. Before the heat mode recording, the thermal heads used had been confirmed to reach 450° C. on passing electricity for 20 msec.

The resulting printing plate was set on a one-side press, Oliver 52 manufactured by Sakurai K.K., and lithographic printing was carried out to obtain 1000 prints using pure water as a fountain solution and Newchampion F Gloss 85 Sumi produced by Dainippon Ink & Chemicals, Inc. as printing ink. As a result, clear prints with no stains on the non-image area were obtained from the start to the end. No scratches were observed on the printing plate.

The surface of the printing plate was cleaned carefully and thoroughly to remove the residual ink with soft cloth impregnated with a printing ink cleaner, Dai-clean R (available from Dainippon Inks & Chemicals, Inc.). The entire surface of the plate was exposed to light under the same conditions as described above. The contact angle was found within the range of from 5 to 7° at every site of measurement.

The printing plate precursor thus regenerated was again recorded with a thermal printer under the same conditions as described above to obtain a printing plate. Lithographic printing was carried out to obtain 500 prints by using the resulting printing plate in the same manner as in the first printing. Clear prints were obtained from the start to the end, and no scratches were observed on the printing plate.

When the above-described procedure for regeneration of the used printing plate, overall exposure, and thermal recording was repeated 5 times, there was observed no change in photosensitivity, i.e., changeability to hydrophilic properties on light irradiation, contact angle, and heat sensitivity in thermal recording. It was thus proved that a printing plate precursor comprising a rolled aluminum support with a titanium oxide heat-sensitive layer can be made into a printing plate by direct thermal recording with a thermal head and can be regenerated for repeated use simply by clearing the printing plate of printing ink.

EXAMPLE 8

A 250 μm thick polyethylene terephthalate (PET) film was put in an electron beam evaporation apparatus and heated to 90° C. After evacuating the chamber to a degree of vacuum of $1.0\times10^{-6}$ Torr, titanium oxide was evaporated by an electron beam under an oxygen pressure of $1.5\times10^{-4}$ Torr to form a titanium oxide thin film on the PET film. X-Ray analysis on the crystal components of the resulting film revealed that the amorphous/anatase/rutile structure ratio was 2/5/3. The thickness of the deposit film was 2 μm. A sample of 510×400 mm was cut out of the $TiO_2$-deposited PET film. The contact angle of the $TiO_2$ layer was 65°.

The sample was exposed to light at a light intensity of 9 mW/cm$^2$ for 2 minutes by means of an exposuring light source, UNIREC URM-600, Model GH-60201X, manufactured by Ushio Inc. The contact angle was 5 to 7° C.

The $TiO_2$ surface layer was imagewise scanned with a beam of a 10 W YAG laser having a wavelength of 1.06 μm with the beam width condensed to 25 μm ($1/e^2$ value).

The resulting printing plate was set on a one-side press, Oliver 52 manufactured by Sakurai K.K., and lithographic printing was carried out to obtain 1000 prints using pure water as a fountain solution and Newchampion F Gloss 85 Sumi produced by Dainippon Ink & Chemicals, Inc. as printing ink. The laser-exposed area constituted an ink-receptive area. As a result, clear prints with no stains on the non-image area were obtained from the start to the end. No scratches were observed on the printing plate.

After the printing, the surface of the printing plate was cleaned carefully and thoroughly to remove the residual ink with soft cloth impregnated with a printing ink cleaner, Dai-clean R (available from Dainippon Inks & Chemicals, Inc.). The plate was entirely exposed to light under the same conditions as described above. The contact angle was found within the range of from 5 to 7° at every site of measurement.

The printing plate precursor thus regenerated was again imagewise scanned under the same conditions as described above, except for changing the scanning pattern, to obtain a printing plate. Lithographic printing was carried out to obtain 500 prints by using the resulting printing plate in the same manner as in the first printing. Clear prints were obtained from the start to the end, and no scratches were observed on the printing plate.

When the above-described procedure was repeated 5 times, there was observed no change in photosensitivity, contact angle, and speed of restoration of contact angle. It was thus proved that a printing plate precursor comprising a PET support with a titanium oxide photosensitive surface layer enables simplified printing and can be regenerated by repeated use by ink removal.

EXAMPLE 9

A 100 μm thick stainless steel (SUS) plate was set in a vacuum deposition apparatus, and zinc selenide was evaporation deposited on the plate to a thickness of 1000 Å under vacuum of $1.5\times10^{-4}$ Torr. The deposit film was oxidized in air at 600° C. for 2 hours to form a thin film of zinc oxide. The plate with the zinc oxide surface layer was cut into a sample of 510×400 mm. The contact angle of the surface layer was 51°.

The entire surface of the sample was exposed to light at a light intensity of 20 mW/cm$^2$ for 10 minutes by means of an exposuring light source, UNIREC URM-600, Model GH-60201X, manufactured by Ushio Inc. The contact angle was found having reduced to 17°.

The zinc oxide surface layer was thermally recorded at a speed of 200 msec/m by use of a thermal printer having thermal heads (150 μm×150 μm in size, arrayed at 250 μm intervals) each comprising a Ta-$SiO_2$ heating resistor and a wear-resistant protective layer of a sialon. Before the thermal recording, the thermal heads used had been confirmed to reach 450° C. on passing electricity for 20 msec.

The resulting printing plate was set on a one-side press, Oliver 52 manufactured by Sakurai K.K., and lithographic printing was carried out to obtain 1000 prints using pure water as a fountain solution and Newchampion F Gloss 85 Sumi produced by Dainippon Ink & Chemicals, Inc. as printing ink. As a result, clear prints with no stains on the non-image area were obtained from the start to the end. No scratches were observed on the printing plate.

The surface of the printing plate was cleaned carefully and thoroughly to remove the residual ink with soft cloth impregnated with a printing ink cleaner, Dai-clean R (available from Dainippon Inks & Chemicals, Inc.). The entire surface of the plate was exposed to light under the same conditions as described above. The contact angle was found within the range of from 17 to 20° at every site of measurement.

The thus regenerated printing plate precursor was again recorded with a thermal printer under the same conditions as described above to obtain a printing plate. Lithographic printing was carried out to obtain 200 prints by using the resulting printing plate in the same manner as in the first printing. Clear prints were obtained from the start to the end, and no scratches were observed on the printing plate.

When the above-described procedure was repeated 5 times, there was observed no change in photosensitivity, i.e., changeability to hydrophilic properties on light irradiation, heat sensitivity in thermal recording, and contact angle restoring properties. It was thus proved that a printing plate precursor comprising a rolled stainless steel support with a zinc oxide heat-sensitive surface thin layer can be made into a printing plate by direct thermal recording with a thermal head and can be regenerated for repeated use simply by removing printing ink.

EXAMPLE 10

A 100 μm thick support was set in a sputtering system. After evacuating the system to $5\times10^{-7}$ Torr, the support was heated to 120° C., and an argon/oxygen mixed gas (50/50 by mole) was introduced to $5\times10^{-3}$ Torr. An RF power of 150 W was applied to a sintered stannic oxide target having a diameter of 6 in. to form a 1000 Å thick tin oxide thin film. A sample of 510×400 mm was cut out of the resulting $SnO_2$-deposited stainless steel plate. The contact angle was 51°.

The entire surface of the sample was exposed to light at a light intensity of 25 mW/cm$^2$ for 10 minutes by means of an exposuring light source, UNIREC URM-600, Model GH-60201X, manufactured by Ushio Inc. The contact angle was found having reduced to 5°.

The surface tin oxide thin layer was imagewise exposed to solid infrared laser light (output 10 W, beam width 45 μm) to effect heat mode drawing by photothermal conversion.

The resulting printing plate was set on a one-side press, Oliver 52 manufactured by Sakurai K.K., and lithographic printing was carried out to obtain 1000 prints using pure water as a fountain solution and Newchampion F Gloss 85 Sumi produced by Dainippon Ink & Chemicals, Inc. as printing ink. As a result, clear prints with no stains on the non-image area were obtained from the start to the end. No scratches were observed on the printing plate.

The surface of the printing plate was cleaned carefully and thoroughly to remove the residual ink with soft cloth impregnated with a printing ink cleaner, Dai-clean R (available from Dainippon Inks & Chemicals, Inc.). The plate was entirely exposed to light under the same conditions as described above. The contact angle was found to be 5°.

The thus regenerated printing plate precursor was again exposed to infrared laser light in the same manner as described above, except for changing the exposure pattern, to obtain a printing plate. Lithographic printing was carried out to obtain 1000 prints by using the resulting printing plate in the same manner as in the first printing. Clear prints were obtained from the start to the end, and no scratches were observed on the printing plate.

When the above-described procedure was repeated 5 times, there was observed no change in photosensitivity, i.e., changeability to hydrophilic properties on light irradiation, contact angle, and photosensitivity in heat mode drawing. It was thus proved that a printing plate precursor comprising a support with a tin oxide photosensitive layer enables simplified printing by heat mode drawing and can be regenerated for repeated use.

EXAMPLE 11

The anodized aluminum support prepared in Example 2 was immersed in a 20% ethanol solution containing cesium ethoxide, titanium butoxide, lanthanum isobutoxide, and niobium ethoxide at a ratio corresponding to the stoichiometrical ratio of $CsLa_2NbTi_2O_{10}$. The coating layer was hydrolyzed and then heated at 200° C. or higher to form a $CsLa_2NbTi_2O_{10}$ thin layer having a thickness of 1000 Å. A sample of 510×400 mm was cut out of the resulting aluminum support with a complex oxide thin film and entirely exposed to light at a light intensity of 25 mW/cm$^2$ for 5 minutes by means of an exposuring light source, UNIREC URM-600, Model GH-60201X, manufactured by Ushio Inc. The contact angle was 10°.

The printing plate precursor was thermally recorded by means of a thermal printer in the same manner as in Example 3 to obtain a printing plate. The printing plate was set on a one-side press, Oliver 52 manufactured by Sakurai K.K., and lithographic printing was carried out to obtain 500 prints using pure water as a fountain solution and Newchampion F Gloss 85 Sumi produced by Dainippon Ink & Chemicals, Inc. as printing ink. As a result, clear prints with no stains on the non-image area were obtained from the start to the end. No scratches were observed on the printing plate.

The surface of the printing plate was cleaned carefully and thoroughly to remove the residual ink with soft cloth impregnated with a printing ink cleaner, Dai-clean R (available from Dainippon Inks & Chemicals, Inc.). The entire surface of the plate was exposed to light under the same conditions as described above. The contact angle was found to be 10°. The printing plate precursor thus regenerated was again thermally recorded in the same manner as described above to obtain a printing plate. Lithographic printing was carried out to obtain 1000 prints by using the resulting printing plate in the same manner as in the first printing. Clear prints were obtained from the start to the end, and no scratches were observed on the printing plate.

It was thus proved that a printing plate precursor having a $CsLa_2NbTi_2O_{10}$ photosensitive layer enables simplified printing by achieving a distinction between a ink-receptive area and a water-wettable area and can be regenerated for repeated use by heat treatment.

The printing plate precursor according to the present invention, which has a thin surface layer consisting mainly of titanium oxide or zinc oxide, becomes hydrophilic on overall exposure to active light. An image area is formed on the hydrophilic surface simply by heat mode drawing without requiring a developer thereby to provide a printing plate with a clear printing surface. The printing plate precursor can be regenerated and used repeatedly by cleaning the used printing plate to remove residual printing ink.

While the invention has been described in detail and with reference to specific embodiments thereof, it will be apparent to one skilled in the art that various changes and modifications can be made therein without departing from the spirit and scope thereof.

What is claimed is:

1. A lithographic printing method comprising repetition of the steps of:

exposing a printing plate precursor having on the surface thereof a thin layer comprising a material selected from the group consisting of $TiO_2$, ZnO and at least one compound selected from the group consisting of $RTiO_2$ wherein R represents an alkaline earth metal atom, $AB_{2-x}C_xD_{3-x}E_xO_{10}$ wherein A represents a hydrogen atom or an alkali metal atom; B represents an alkaline earth metal atom or a lead atom; C represents a rare earth atom; D represents a metal atom of the group 5A of the Periodic Table; E represents a metal atom of the group 4A of the Periodic Table; and x represents a number from 0 to 2, $SnO_2$, $Bi_2O_3$ and $Fe_2O_3$ to active light to make the material of the exposed area hydrophilic, and making the hydrophilic area hydrophobic by heat treatment.

2. The lithographic printing method according to claim 1, wherein the thin layer as in claim 1 is formed on the surface of a plate cylinder of a lithographic printing machine.

3. A lithographic printing method comprising the steps of:

imagewise exposing with active light a printing plate precursor having on the surface thereof a thin layer comprising a material selected from the group consisting of $TiO_2$, ZnO and at least one compound selected from the group consisting of $RTiO_2$ wherein R represents an alkaline earth metal atom, $AB_{2-x}C_xD_{3-x}E_xO_{10}$ wherein A represents a hydrogen atom or an aikali metal atom; B represents an alkaline earth metal atom or a lead atom; C represents a rare earth atom; D represents a metal atom of the group 5A of the Periodic Table; E represents a metal atom of the group 4A of the Periodic Table; and x represents a number from 0 to 2, $SnO_2$, $Bi_2O_3$ and $Fe_2O_3$ to make the material of the exposed area hydrophilic, contacting the imagewise exposed surface with printing ink to form a printing surface the image area of which receives the ink to carry out lithographic printing, cleaning the printing surface after the printing to remove any residual ink, making the hydrophilic area hydrophobic by heat treatment and repeating the steps so as to repeatedly use the imagewise exposed surface for printing.

4. The lithographic printing method according to claim 3, wherein the printing plate precursor after printing is heated at 80° C. or higher before reuse.

5. The lithographic printing method according to claim 3, wherein said thin layer is formed on the surface of a plate cylinder of a lithographic printing machine.

6. A lithographic printing method comprising the steps of:

exposing the entire surface of a printing plate precursor having on the surface thereof a thin layer comprising a material selected from the group consisting of $TiO_2$, ZnO and at least one compound selected from the group consisting of $RTiO_2$ wherein R represents an alkaline earth metal atom, $AB_{2-x}C_xD_{3-x}E_xO_{10}$ wherein A represents a hydrogen atom or an alkali metal atom; B represents an alkaline earth metal atom or a lead atom; C represents a rare earth atom; D represents a metal atom of the group 5A of the Periodic Table; E represents a metal atom of the group 4A of the Periodic Table; and x represents a number from 0 to 2, $SnO_2$, $Bi_2O_3$ and $Fe_2O_3$ to active light to make the material of the exposed surface hydrophilic, drawing an image by heat to obtain a printing plate having hydrophobic areas formed by the heat, contacting the printing plate with printing ink to form a printing surface the image area of which receives the ink to carry out printing, cleaning the printing surface after the printing to remove any residual ink, and repeating the steps so that the printing plate obtained from the printing plate precursor is repeatedly used for printing.

7. The lithographic printing method according to claim 6, wherein the printing plate precursor after printing is heated at 80° C. or higher before reuse.

8. The lithographic printing method according to claim 6, wherein said thin layer is formed on the surface of a plate cylinder of a lithographic printing machine.

* * * * *